(12) United States Patent
Kim

(10) Patent No.: US 10,148,242 B2
(45) Date of Patent: Dec. 4, 2018

(54) METHOD FOR REPRODUCING CONTENTS AND ELECTRONIC DEVICE THEREOF

(71) Applicant: Samsung Electronics Co., Ltd., Gyeonggi-do (KR)

(72) Inventor: Jae-Hoon Kim, Gyeonggi-do (KR)

(73) Assignee: Samsung Electronics Co., Ltd (KR)

(*) Notice: Subject to any disclaimer, the term of this patent is extended or adjusted under 35 U.S.C. 154(b) by 22 days.

(21) Appl. No.: 14/872,798

(22) Filed: Oct. 1, 2015

(65) Prior Publication Data
US 2016/0099009 A1 Apr. 7, 2016

(30) Foreign Application Priority Data
Oct. 1, 2014 (KR) .................. 10-2014-0132409

(51) Int. Cl.
| | |
|---|---|
| *H03G 5/16* | (2006.01) |
| *H04S 7/00* | (2006.01) |
| *H04R 3/04* | (2006.01) |
| *H04M 1/60* | (2006.01) |
| *H04M 1/725* | (2006.01) |

(52) U.S. Cl.
CPC ........ *H03G 5/165* (2013.01); *H04M 1/72558* (2013.01); *H04S 7/305* (2013.01); *H04S 7/307* (2013.01); *G10H 2210/305* (2013.01); *G10H 2220/106* (2013.01); *G10H 2220/351* (2013.01); *G10H 2220/371* (2013.01); *G10H 2220/376* (2013.01); *G10H 2220/395* (2013.01); *G10H 2220/455* (2013.01); *G10H 2230/015* (2013.01); *H04M 1/6016* (2013.01); *H04M 1/7253* (2013.01); *H04R 3/04* (2013.01); *H04R 2499/11* (2013.01); *H04S 7/40* (2013.01); *H04S 2400/11* (2013.01)

(58) Field of Classification Search
CPC H03G 5/165; H04M 1/72558; H04M 1/7253; H04M 1/6016; H04S 7/305; H04S 7/307; H04S 2400/11; H04S 7/40; G10H 2210/305; G10H 2220/455; G10H 2220/395; G10H 2220/376; G10H 2220/371; G10H 2230/015; G10H 2220/351; G10H 2220/106; H04R 2499/11; H04R 3/04
See application file for complete search history.

(56) References Cited

U.S. PATENT DOCUMENTS 6,826,282 B1 * 11/2004 Pachet ............... H04S 7/30
381/310
7,149,691 B2 * 12/2006 Balan ................ G10L 15/22
704/270

(Continued)

FOREIGN PATENT DOCUMENTS

| EP | 1617702 A1 * | 1/2006 | ............. H04S 7/302 |
|---|---|---|---|
| JP | 2006-197508 | 7/2006 | |

*Primary Examiner* — Oyesola C Ojo
(74) *Attorney, Agent, or Firm* — The Farrell Law Firm, P.C.

(57) ABSTRACT

An electronic device for reproducing data and a method thereof are provided. The electronic device includes a memory; and a processor. The processor is configured to determine a spatial characteristic of a space where content is reproduced, store the spatial characteristic in the memory, and change a sound of the content based on the spatial characteristic when the content is reproduced.

18 Claims, 11 Drawing Sheets

(56) References Cited

U.S. PATENT DOCUMENTS

| | | | | |
|---|---|---|---|---|
| 7,590,249 B2* | 9/2009 | Jang | | H04S 7/30 381/22 |
| 8,023,659 B2* | 9/2011 | Hamanaka | | H04R 3/12 381/1 |
| 8,482,576 B1 | 7/2013 | Yelsey | | |
| 8,660,679 B2* | 2/2014 | Kurabayashi | | G06T 19/006 700/94 |
| 9,756,449 B2* | 9/2017 | Van Der Wijst | | H04S 7/304 |
| 9,838,823 B2* | 12/2017 | Song | | G10L 19/008 |
| 9,883,311 B2* | 1/2018 | Breebaart | | H04S 7/30 |
| 9,942,688 B2* | 4/2018 | Robinson | | H04S 3/008 |
| 2006/0109988 A1* | 5/2006 | Metcalf | | H04S 3/002 381/104 |
| 2006/0206221 A1* | 9/2006 | Metcalf | | G10H 1/0091 700/94 |
| 2007/0189551 A1* | 8/2007 | Kimijima | | H04S 7/302 381/97 |
| 2008/0019535 A1* | 1/2008 | Mitsuhashi | | H04S 7/305 381/66 |
| 2008/0156178 A1* | 7/2008 | Georges | | G10H 1/0025 84/645 |
| 2008/0168349 A1* | 7/2008 | Lamiraux | | G06F 3/0482 715/702 |
| 2008/0243278 A1* | 10/2008 | Dalton | | H04S 7/304 700/94 |
| 2010/0086141 A1* | 4/2010 | Nicolino, Jr. | | H04R 5/04 381/57 |
| 2010/0107102 A1* | 4/2010 | Wang | | G06F 9/4443 715/771 |
| 2010/0245267 A1* | 9/2010 | Min | | G06F 3/04883 345/173 |
| 2012/0183162 A1* | 7/2012 | Chabanne | | H04N 5/642 381/306 |
| 2013/0254714 A1* | 9/2013 | Shin | | G06F 3/0482 715/810 |
| 2013/0315405 A1* | 11/2013 | Kanishima | | H04R 29/00 381/58 |
| 2014/0226842 A1* | 8/2014 | Shenoy | | H04N 7/147 381/303 |
| 2014/0270188 A1* | 9/2014 | Hall | | H04S 7/303 381/17 |
| 2014/0369506 A1* | 12/2014 | Arrasvuori | | G01S 3/8083 381/17 |
| 2014/0376754 A1* | 12/2014 | Banerjea | | H04S 3/004 381/311 |
| 2015/0016641 A1* | 1/2015 | Ugur | | G10L 21/0216 381/303 |
| 2015/0169280 A1* | 6/2015 | Suzuki | | H03G 5/025 715/716 |
| 2015/0189457 A1* | 7/2015 | Donaldson | | H04S 7/303 381/1 |
| 2015/0264131 A1* | 9/2015 | Goldstein | | G06F 3/165 709/223 |
| 2015/0334505 A1* | 11/2015 | Crutchfield | | H04S 7/40 381/17 |
| 2015/0373474 A1* | 12/2015 | Kraft | | H04R 1/1083 381/17 |
| 2016/0021477 A1* | 1/2016 | Hiipakka | | H04S 5/005 386/285 |
| 2016/0043699 A1* | 2/2016 | Sawa | | H04R 1/406 381/57 |
| 2016/0088417 A1* | 3/2016 | Kim | | G02B 27/017 381/17 |
| 2016/0150333 A1* | 5/2016 | Goldstein | | G06F 17/30743 381/56 |

* cited by examiner

METHOD FOR REPRODUCING CONTENTS AND ELECTRONIC DEVICE THEREOF

PRIORITY

The present application claims priority under 35 U.S.C. § 119(a) to a Korean patent application filed in the Korean Intellectual Property Office on Oct. 1, 2014 and assigned Serial No. 10-2014-0132409, the contents of which are incorporated herein by reference.

BACKGROUND

1. Field of the Invention

The present invention relates generally to a method for reproducing contents and an electronic device thereof.

2. Description of the Related Art

An electronic device, such as a mobile terminal or a smartphone, is provided with a display module of a large screen touch method, and is provided with a high-pixel camera module in addition to the basic function of communicating with other devices, so that the electronic device can photograph a still image or a moving image, and access a network to be able to perform web surfing. Such an electronic device is being developed to be equipped with a high performance processor and thus can perform various functions. For example, the electronic device can reproduce various types of multimedia contents, such as an electronic book, music, a moving image, and the like.

An electronic device is able to call contents stored internally or externally (in other words, pre-stored contents, or contents stored in a server or other electronic devices), and process the contents to be outputted through a speaker or the like.

The electronic device can enhance content reproduction performance by adjusting the sound of the content when outputting the content. For example, the electronic device can reinforce a specific register using an equalizer function. As another example, the electronic device can reinforce an echo, reverberation, or the like using a sound field effect.

The above-described function is problematic in that users may not recognize the effect being enhanced. For example, high-pitched tones and low-pitched tones may be enhanced through the equalizer function, but general users may not recognize that the high-pitched tones and the low-pitched tones are enhanced.

SUMMARY

The present invention has been made to solve at least the above-mentioned problems and/or disadvantages and to provide at least the advantages described below. Accordingly, an aspect of the present invention is to provide an apparatus and method for visually providing information regarding a situation in which a sound is changed in an electronic device.

Another aspect of the present invention is to provide an apparatus and method for changing a sound by defining a spatial characteristic in an electronic device.

Another aspect of the present invention is to provide an apparatus and method for detecting a spatial characteristic based on environment information or situation information at a content reproduction time in an electronic device.

According to an aspect of the present invention, an electronic device is provided, which includes a memory, and a processor. The processor is configured to determine a spatial characteristic of a space where content is reproduced, store the spatial characteristic in the memory, and change a sound of the content based on the spatial characteristic when the content is reproduced.

According to another aspect of the present invention, an operation method of an electronic device is provided. A setting screen is output for defining a spatial characteristic for a content reproduction environment. The spatial characteristic is defined by detecting an input on the outputted setting screen. A sound of content is changed and the content is reproduced based on the spatial characteristic.

According to another aspect of the present invention, a non-transitory computer-readable recording medium is provided that records a program for executing operations. The operations include outputting a setting screen for defining a spatial characteristic for a content reproduction environment; defining the spatial characteristic by detecting an input on the outputted setting screen; and changing a sound of content and reproducing the content based on the spatial characteristic.

BRIEF DESCRIPTION OF THE DRAWINGS

The above and other aspects, features, and advantages of certain embodiments of the present invention will be more apparent from the following description, taken in conjunction with the accompanying drawings, in which like reference numerals represent like parts.

DETAILED DESCRIPTION OF EMBODIMENTS OF THE PRESENT INVENTION

Figure 1:
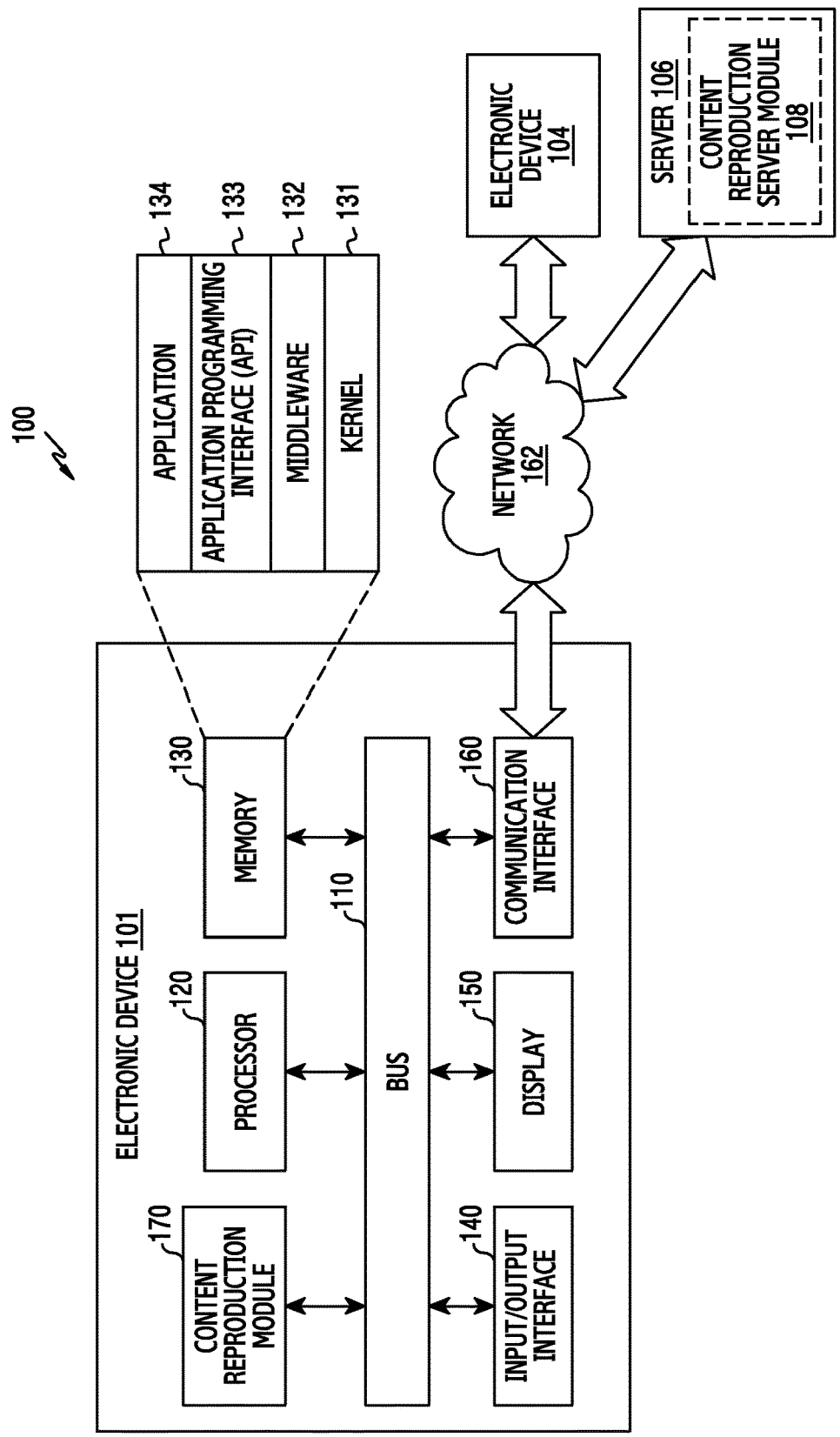
FIG. 1 is a block diagram illustrating a network environment including an electronic device according to an embodiment of the present invention.

Hereinafter, various embodiments of the present invention will be described with reference to the accompanying drawings. In describing the drawings, similar reference numerals may be used to designate similar elements. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

The terms "have", "may have", "include", or "may include" used in the various embodiments of the present invention indicate the presence of disclosed corresponding functions, operations, elements, and the like, and do not limit additional one or more functions, operations, elements, and the like. In addition, it should be understood that the terms "include" or "have" used in the various embodiments of the present invention are to indicate the presence of features, numbers, steps, operations, elements, parts, or a combination thereof described in the specification, and do not preclude the presence or addition of one or more other features, numbers, steps, operations, elements, parts, or a combination thereof.

The terms "A or B", "at least one of A or/and B" or "one or more of A or/and B" used in the various embodiments of the present invention include any and all combinations of words enumerated with it. For example, "A or B", "at least one of A and B" or "at least one of A or B" means (1) including at least one A, (2) including at least one B, or (3) including both at least one A and at least one B.

Although terms such as "first" and "second" used in various embodiments of the present invention may modify various elements of various embodiments, these terms do not limit the corresponding elements. For example, these terms do not limit an order and/or importance of the corresponding elements. These terms may be used for the purpose of distinguishing one element from another element. For example, a first user device and a second user device all indicate user devices and may indicate different user devices. For example, a first element may be referred to as a second element without departing from the scope of right of various embodiments of the present invention, and similarly, a second element may be referred to as a first element.

It will be understood that when an element (e.g., first element) is "connected to" or "(operatively or communicatively) coupled with/to" another element (e.g., second element), the element may be directly connected or coupled to the other element, or there may be an intervening element (e.g., third element) between the element and the other element. To the contrary, it will be understood that when an element (e.g., first element) is "directly connected" or "directly coupled" to another element (e.g., second element), there is no intervening element (e.g., third element) between the element and the other element.

The expressions "configured to (or set to)" used in various embodiments of the present invention may be replaced with "suitable for", "having the capacity to", "designed to", "adapted to", "made to", or "capable of" according to a situation. The terms "configured to (set to)" do not necessarily mean "specifically designed to" in a hardware level. Instead, the expressions "apparatus configured to . . . " may mean that the apparatus is "capable of . . . " along with other devices or parts in a certain situation. For example, "a processor configured to (set to) perform A, B, and C" may be a dedicated processor, e.g., an embedded processor, for performing a corresponding operation, or a generic-purpose processor, e.g., a Central Processing Unit (CPU) or an application processor (AP), capable of performing a corresponding operation by executing one or more software programs stored in a memory device.

The terms as used herein are used merely to describe certain embodiments and are not intended to limit the present invention. As used herein, singular forms may include plural forms as well unless the context explicitly indicates otherwise. Further, all the terms used herein, including technical and scientific terms, should be interpreted to have the same meanings as commonly understood by those skilled in the art to which the present invention pertains, and should not be interpreted to have ideal or excessively formal meanings unless explicitly defined in various embodiments of the present invention.

The module or programming module, according to various embodiments of the present invention, may further include at least one or more constitutional elements among the aforementioned constitutional elements, or may omit some of them, or may further include additional other constitutional elements. Operations performed by a module, a programming module, or other constitutional elements according to various embodiments of the present invention may be executed in a sequential, parallel, repetitive, or heuristic manner. In addition, some of the operations may be executed in a different order or may be omitted, or other operations may be added.

An electronic device, according to various embodiments of the present invention, may be a device including a communication function. For example, the electronic device may include at least one of: a smart phone; a tablet personal computer (PC); a mobile phone; a video phone; an e-book reader; a desktop PC; a laptop PC; a netbook computer; a workstation, a server, a personal digital assistant (PDA); a portable multimedia player (PMP); an MP3 player; a mobile medical device; a camera; or a wearable device (e.g., a head-mount-device (HMD), an electronic glasses, an electronic clothing, an electronic bracelet, an electronic necklace, an electronic appcessory, an electronic tattoo, a smart mirror, or a smart watch).

In various embodiments of the present invention, an electronic device may be a smart home appliance including a communication function. For example, such appliances may include at least one of: a television (TV); a digital versatile disc (DVD) player; an audio component; a refrigerator; an air conditioner; a vacuum cleaner; an oven; a microwave oven; a washing machine; an air cleaner; a set-top box; a home automation control panel; a security control panel; a TV box; a game console; an electronic dictionary; an electronic key; a camcorder; or an electronic frame.

In various embodiments of the present invention, an electronic device may include at least one of: a medical equipment (e.g., a mobile medical device (e.g., a blood glucose monitoring device, a heart rate monitor, a blood pressure monitoring device or a temperature meter), a magnetic resonance angiography (MRA) machine, a magnetic resonance imaging (MRI) machine, a computed tomography (CT) scanner, or an ultrasound machine); a navigation device; a global positioning system (GPS) receiver; an event data recorder (EDR); a flight data recorder (FDR); an in-vehicle infotainment device; an electronic equipment for a ship (e.g., ship navigation equipment and/or a gyrocompass); an avionics equipment; a security equipment; a head unit for vehicle; an industrial or home robot; an automatic teller's machine (ATM) of a financial institution, point of sale (POS) device at a retail store, or an internet of things device (e.g., a light bulb, various sensors, an electronic meter, a gas meter, a sprinkler, a fire alarm, a thermostat, a streetlamp, a toaster, a sporting equipment, a hot-water tank, a heater, or a boiler and the like).

In various embodiments of the present invention, an electronic device may include at least one of: a piece of furniture or a building/structure; an electronic board; an electronic signature receiving device; a projector; and various measuring instruments (e.g., a water meter, an electricity meter, a gas meter, or a wave meter), each of which includes a communication function.

An electronic device, according to various embodiments of the present invention, may also include a combination of one or more of the above-mentioned devices.

Further, it will be apparent to those skilled in the art that an electronic device, according to various embodiments of the present invention, is not limited to the above-mentioned devices.

Herein, the term "user" may indicate a person who uses an electronic device or a device (e.g., an artificial intelligence electronic device) that uses the electronic device.

Hereinafter, various embodiments of the present invention will describe a technology for sharing contents by an electronic device.

FIG. 1 is a diagram illustrating a network environment 100 including an electronic device 101, according to an embodiment of the present invention. Referring to FIG. 1, the electronic device 101 may include a bus 110, a processor 120, a memory 130, an input/output (I/O) interface 140, a display 150, a communication interface 160, and content reproduction module 170.

The bus 110 is a circuit for connecting the above-described elements with each other, and transferring communication (e.g., a control message) between the above-described elements.

The processor 120 may include a central processing unit (CPU), a communication processor (CP), a graphic processing unit (GPU).

The processor 120 receives, for example, an instruction from the above-described other elements (e.g., the memory 130, the I/O interface 140, the display 150, or the communication interface 160, etc.) via the bus 110, deciphers the received instruction, and executes an operation or a data process corresponding to the deciphered instruction.

The memory 130 stores an instruction or data received from the processor 120 or other elements (e.g., the I/O interface 140, the display 150, or the communication interface 160, etc.), or generated by the processor 120 or other elements. The memory 130 may include, for example, programming modules such as a kernel 131, a middleware 132, an application programming interface (API) 133, or an application 134. Each of the programming modules may be configured using software, firmware, hardware, or a combination of two or more of these.

The kernel 131 controls or manages system resources (e.g., the bus 110, the processor 120, or the memory 130, etc.) used for executing an operation or a function implemented in the rest of the programming modules, for example, the middleware 132, the API 133, or the application 134. Also, the kernel 131 may provide an interface for allowing the middleware 132, the API 133, or the application 134 to access an individual element of the electronic device 101 and control or manage the same.

The middleware 132 performs a mediation role so that the API 133 or the application 134 may communicate with the kernel 131 to give and take data. Also, in connection with task requests received from the applications 147, the middleware 132 performs a control (e.g., scheduling or load balancing) for a task request using, for example, a method of assigning priority that may use a system resource (e.g., the bus 110, the processor 120, or the memory 130, etc.) of the electronic device 101 to at least one application 134.

The API 133 is an interface for allowing the application 134 to control a function provided by the kernel 131 or the middleware 132, and may include at least one interface or function (e.g., an instruction) for file control, window control, image processing, or character control, etc.

According to various embodiments of the present invention, the application 134 may include a Short Message Service/Multimedia Messaging Service (SMS/MMS) application, an e-mail application, a calendar application, alarm application, a health care application (e.g., an application for measuring quantity of motion or blood sugar, etc.), or an environment information application (e.g., an application providing atmospheric pressure, humidity or temperature information, etc.). Alternatively, the application 134 may be an application related to information exchange between the electronic device 101 and an external electronic device 104. The application related to the information exchange may include, for example, a notification relay application for transferring specific information to the external electronic device 104 or a device management application for managing the external electronic device 104.

For example, the notification relay application may include a function for transferring notification information generated from a different application (e.g., an SMS/MMS application, an e-mail application, a health care application, or an environment information application) of the electronic device 101 to the external electronic device 104. Alternatively, the notification relay application may, for example, receive notification information from the external electronic device 104 and provide the same to a user. The device management application may manage (e.g., install, delete, or update) a function (e.g., turn-on/turn-off of an external electronic device itself (or some constituent part) or luminance (or resolution) control of a display) of the external electronic device 104 communicating with the electronic device 101 and an application operating in the external electronic device 104 or a service (e.g., a communication service or a message service) provided by the external electronic device 104.

According to various embodiments of the present invention, the application 134 may include a designated application depending on an attribute (e.g., a kind of an electronic device) of the external electronic device 104. For example, when the external electronic device 104 is an MP3 player, the application 134 may include an application related to music reproduction. Similarly, when the external electronic device 104 is a mobile medical health care device, the application 134 may include an application related to health care. According to an embodiment of the present invention, the application 134 may include at least one of an application designated in the electronic device 101 and an application received from the external electronic device 104. The above description related to external electronic device 104 may also apply to a server 106.

The I/O interface 140 transfers an instruction or data input from a user via an I/O unit (e.g., a sensor, a keyboard, or a touchscreen) to the processor 120, the memory 130, or the communication interface 160 via the bus 110, for example. For example, the I/O interface 140 may provide data regarding a user's touch input via the touchscreen to the processor 120. Also, the I/O interface 140 may, for example, output an instruction or data received via the bus 110 from the processor 120, the memory 130, or the communication interface 160 via the I/O unit (e.g., a speaker or a display). For example, the I/O interface 140 may output voice data processed by the processor 120 to a user via a speaker.

The display 150 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 150 displays various types of contents (for example, text, images, videos, icons, or symbols) for users. The display 150 may include a touch screen, and may receive, for example, a touch, gesture, proximity, or hovering input by using an electronic pen or a part of the user's body.

The communication interface 160 establishes communication between the electronic device 101 and an external device (e.g., the electronic device 104 or the server 106). For example, the communication interface 160 may be connected to a network 162 via wireless communication or wired communication to communicate with the external device. The wireless communication may, for example, include at least one of Wireless Fidelity (Wi-Fi), Bluetooth (BT), Near Field Communication (NFC), a Global Positioning System (GPS), or cellular communication (e.g., Long Term Evolution (LTE), LTE Advanced (LTE-A), Code Division Multiple Access (CDMA), Wideband CDMA (WCDMA), Universal Mobile Telecommunications System (UMTS), Wireless Broadband (WiBro), or Global System for Mobile communications (GSM), etc.). The wired communication may include, for example, at least one of a Universal Serial Bus (USB), a High Definition Multimedia Interface (HDMI), Recommended Standard 232 (RS-232), and Plain Old Telephone Service (POTS).

According to an embodiment of the present invention, the network 162 may be a telecommunications network. The telecommunications network may include at least one of a computer network, the Internet, an Internet of Things, and a telephone network. According to an embodiment of the present invention, a protocol (e.g., a transport layer protocol, a data link layer protocol, or a physical layer protocol) for communication between the electronic device 101 and an external device may be supported by at least one of the application 134, the application programming interface 133, the middleware 132, the kernel 131, or the communication interface 160.

The server 106 supports driving of the electronic device 101 by performing at least one of the operations (or functions) implemented in the electronic device 101. For example, the server 106 may include a data generation server module 108 for supporting the content reproduction module 170 implemented in the electronic device 101. For example, the data generation server module 108 may include at least one element of the content reproduction module 170 and perform at least one of the operations performed by the content reproduction module 170 (for example, on behalf of the content reproduction module 170).

According to an embodiment of the present invention, the content reproduction module 170 outputs a setting screen for changing a sound of a content. According to an embodiment of the present invention, the content reproduction module 170 outputs a setting screen for setting a spatial characteristic on a location where a content is reproduced. For example, the spatial characteristic may include the size of a space where a content is reproduced, the material of the space, the location of a sound source in the space, the location of a user in the space.

According to various embodiments of the present invention, the content reproduction module 170 changes the sound of the content based on the spatial characteristic set through the setting screen.

According to an embodiment of the present invention, the content reproduction module 170 stresses a specific register or provides an echo (or reverb) effect, a reverberation effect, or the like when reproducing the content, based on the spatial characteristic of the space where the content is reproduced.

Additional information on the content reproduction module 170 will be provided with reference to FIGS. 2 to 10.

Figure 2:
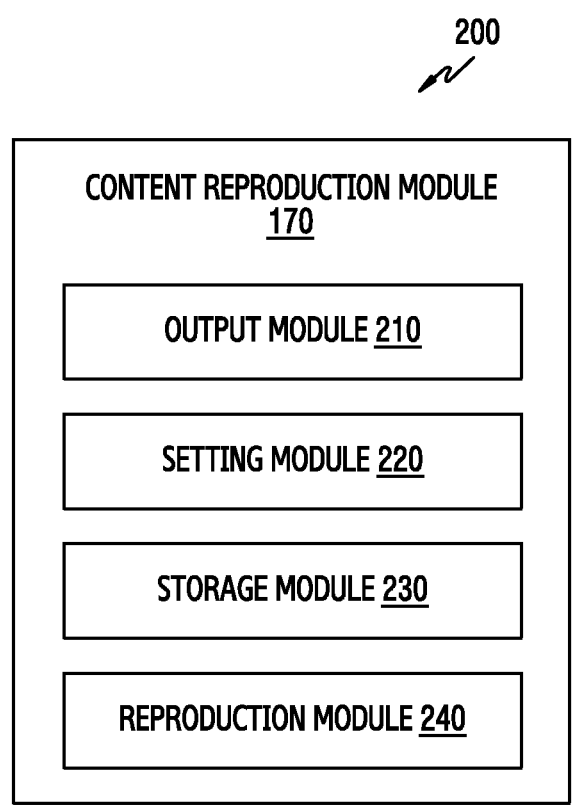
FIG. 2 is a block diagram illustrating a configuration of a content reproduction module according to an embodiment of the present invention.

FIG. 2 is a diagram illustrating a configuration 200 of the content reproduction module 170, according to an embodiment of the present invention. Referring to FIG. 2, the content reproduction module 170 may be configured to include an output module 210, a setting module 220, a storage module 230, and a reproduction module 240.

The output module 210 may output a setting screen for changing a sound of a content. For example, changing the sound of the content may correspond to supplementing a frequency characteristic regarding the sound or providing a sense of space (or a three-dimensional (3D) effect). According to an embodiment of the present invention, supplementing the frequency characteristic may correspond to changing equalizer settings (for example, reinforcing a low-pitched tone, reinforcing a high-pitched tone, adjusting a sound generation direction, or the like), and providing the sense of space may correspond to changing settings of a sound field (for example, reinforcing stereo, reinforcing reverberation, reinforcing an echo, or the like).

According to an embodiment of the present invention, the setting screen may be configured by an interface for setting a reproduction environment. According to an embodiment of the present invention, the reproduction environment may be a spatial characteristic on a location where a content is reproduced. According to an embodiment of the present invention, the spatial characteristic may include the size of a space where a content is reproduced, the material of the space, the location of a sound source in the space, and the location of a user in the space, and the like.

According to an embodiment of the present invention, the spatial characteristic may be related to changing the sound of the content. For example, the size of the space where the content is reproduced, and the material of the space, or the like may be related to an echo (or a reverb) effect and a reverberation effect. As another example, the location of the sound source in the space where the content is reproduced, the location of the user, or the like may be related to a 3D effect on the content.

According to various embodiments of the present invention, the output module 210 may output a setting screen for selecting the size of the space, the material of the space, or the like in order to adjust the echo effect. For example, the output module 210 may provide a list of a plurality of materials to be related to the wall or floor of the space, such as a carpet material, a tile material, a wood material, and the like. According to an embodiment of the present invention, the output module 210 may provide the carpet material as a material for reducing the echo effect, and may provide the tile material as a material for increasing the echo effect.

According to various embodiments of the present invention, the output module 210 may output a setting screen for selecting the size of the space in order to adjust the reverberation effect. For example, the output module 210 may provide a list of a plurality of virtual spaces to be related to the location of the terminal to reproduce the content, such as a concert hall, an outdoor hall, an indoor hall, and the like. According to an embodiment of the present invention, the output module 210 may provide the concert hall as a virtual space for increasing the reverberation effect, and may provide the outdoor hall as a virtual space for reducing the reverberation effect.

According to various embodiments of the present invention, the output module 210 may output a setting screen for selecting the location of the sound source or the number of sound sources in order to adjust the 3D effect. For example, the output module 210 may provide a location to be related to the sound source (for example, a musical instrument, a speaker, a microphone, and the like) which generates a sound.

The setting module 220 may set a reproduction environment for the content based on an input (for example, a touch input, a key button input, a voice input, a gesture input, or the like) on the setting screen which is outputted by the output module 210.

According to an embodiment of the present invention, the setting module 220 may detect a user's input and determine the size of the space where the content is reproduced, the material of the space, the location of the sound source, or the like.

According to various embodiments of the present invention, the setting module 220 may process the sound of the content to be changed according to the reproduction environment. For example, the setting module 220 may set an equalizer or a sound field to bring up the echo and the reverberation effect when reproducing the content, based on the size of the space and the material of the space. As another example, the setting module 220 may set the equalizer or the sound field to bring up the 3D effect when reproducing the content, based on the location of the sound source.

According to various embodiments of the present invention, when the electronic device detects the characteristic of the space where the electronic device is located, the setting module 210 may determine the size of the space where the content is reproduced, the material of the space, and the location of the sound source according to the detected characteristic. For example, the setting module 210 may detect the characteristic (for example, a space size, a space material, or the like) of a current space by analyzing the image on the space where the sound or the content is reproduced, and may provide information on the detected characteristic of the space or process the sound to be changed according to the detected characteristic of the space.

The storage module 230 may store at least one content. The content stored in the storage module 230 may be generated by the electronic device, or may be acquired from another electronic device or a server (for example, a content server, or the like) and stored. According to various embodiments of the present invention, the storage module 230 may store a reproduction environment which is set according to a user's input. According to an embodiment of the present invention, the reproduction environment may be related to respective contents. According to various embodiments of the present invention, the storage module 230 may store information on the sound which should be changed according to each of the spatial characteristics.

The reproduction module 240 may process at least one pre-stored content to be reproduced. According to various embodiments of the present invention, the reproduction module 240 may reproduce the content based on a pre-set reproduction environment. For example, the reproduction module 240 may process the content to be outputted with a sound corresponding to a predetermined size of a space, a predetermined material of the space, a predetermined location of a sound source, or the like.

According to various embodiments of the present invention, the electronic device may include a memory, and a processor configured to determine a spatial characteristic on a space where a content is reproduced and store the spatial characteristic in the memory, and configured to change a sound of the content based on the stored spatial characteristic when the content is reproduced.

According to various embodiments of the present invention, the spatial characteristic defines a virtual space representing a space where the content is reproduced, and the processor may be configured to determine the spatial characteristic based on at least one of a user input, environment information or situation information acquired by the electronic device.

According to various embodiments of the present invention, the processor may be configured to determine the spatial characteristic based on at least one of a size of the space where the content is reproduced, a material of the space, a location of a sound source in the space, a size of a sound source in the space, and a location of a user in the space.

According to various embodiments of the present invention, the processor may be configured to supplement a frequency characteristic on the sound of the content based on the spatial characteristic.

According to various embodiments of the present invention, the processor may be configured to provide a 3D effect on the sound of content based on the spatial characteristic.

According to various embodiments of the present invention, the processor may be configured to identify the environment information based on at least one of brightness information related to a surrounding environment, an image related to the surrounding environment, and sound information related to the surrounding environment.

According to various embodiments of the present invention, the processor may be configured to identify the situation information based on information related to at least one of time displayed on the electronic device and movement of the electronic device.

According to various embodiments of the present invention, the processor may be configured to provide a list of musical instruments related to a specific register.

According to various embodiments of the present invention, the processor may be configured to change the sound of the content using a frequency related to a musical instrument selected from the list of musical instruments.

Figure 3:
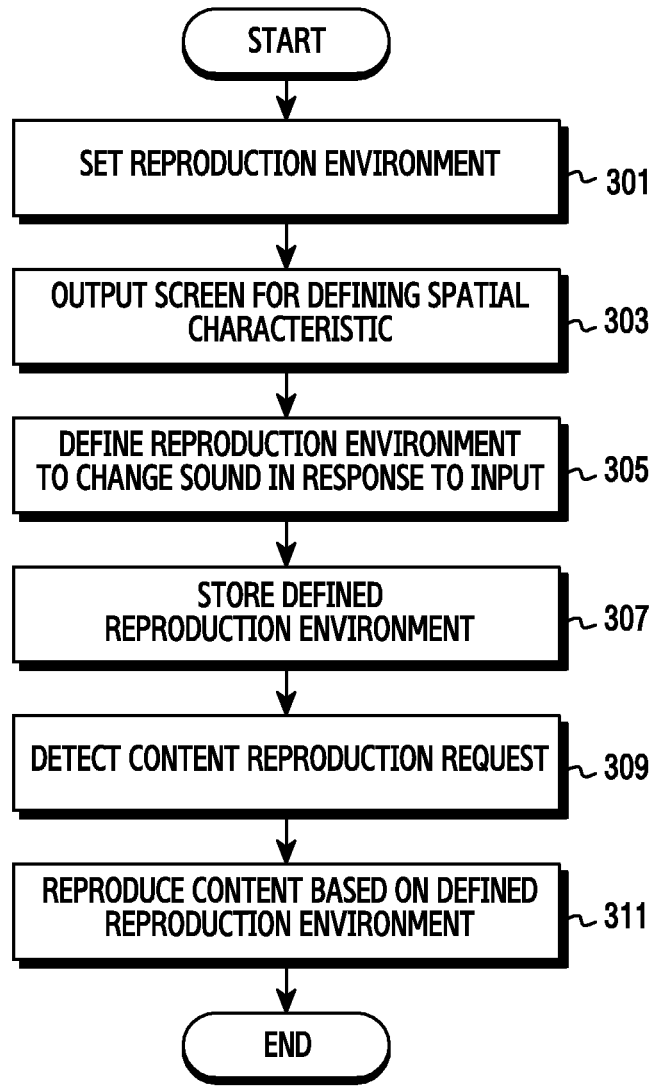
FIG. 3 is a flowchart illustrating a content reproduction operation of an electronic device according to an embodiment of the present invention.

FIG. 3 is a flowchart illustrating a content reproduction operation of an electronic device according to an embodiment of the present invention.

According to various embodiments of the present invention, the electronic device may change a sound of a content using a spatial characteristic.

In step 301, the electronic device sets a reproduction environment. According to an embodiment of the present invention, the reproduction environment may be an environment for changing the sound of the content, and the electronic device may set the reproduction environment by defining a spatial characteristic on a location (space) where the content is reproduced. According to an embodiment of the present invention, the spatial characteristic may include the size of a space where a content is reproduced, the floor or wall surface material of the space, the location of a sound source (for example, a speaker) in the space, the location of a user in the space, and the like. According to various embodiments of the present invention, the electronic device may detect a user's input and enter a mode for setting the reproduction environment.

In step 303, the electronic device outputs a setting screen for defining (or setting) the spatial characteristic for a content reproduction environment. According to various embodiments of the present invention, the setting screen may be a screen for adjusting an echo (or reverb) effect, a reverberation effect, a 3D effect, or the like on the content using the spatial characteristic. According to various embodiments of the present invention, the setting screen may be configured to change the location of the sound source or the user or the material of the space in order to adjust the echo effect. According to various embodiments of the present invention, the setting screen may be configured to adjust the size of the space in order to adjust the reverberation effect. According to various embodiments of the present invention, the setting screen may be configured to add or delete a sound source in order to adjust the 3D effect and add or delete a musical instrument for stressing a specific register.

In step 305, the electronic device defines the reproduction environment (or the spatial characteristic) to change the sound according to an input. According to various embodiments of the present invention, the electronic device may detect an input to define or change the size of the space where the content is reproduced, the material of the space, the location of the sound source in the space, the location of the user in the space, or the like through the outputted setting screen.

Figure 5:
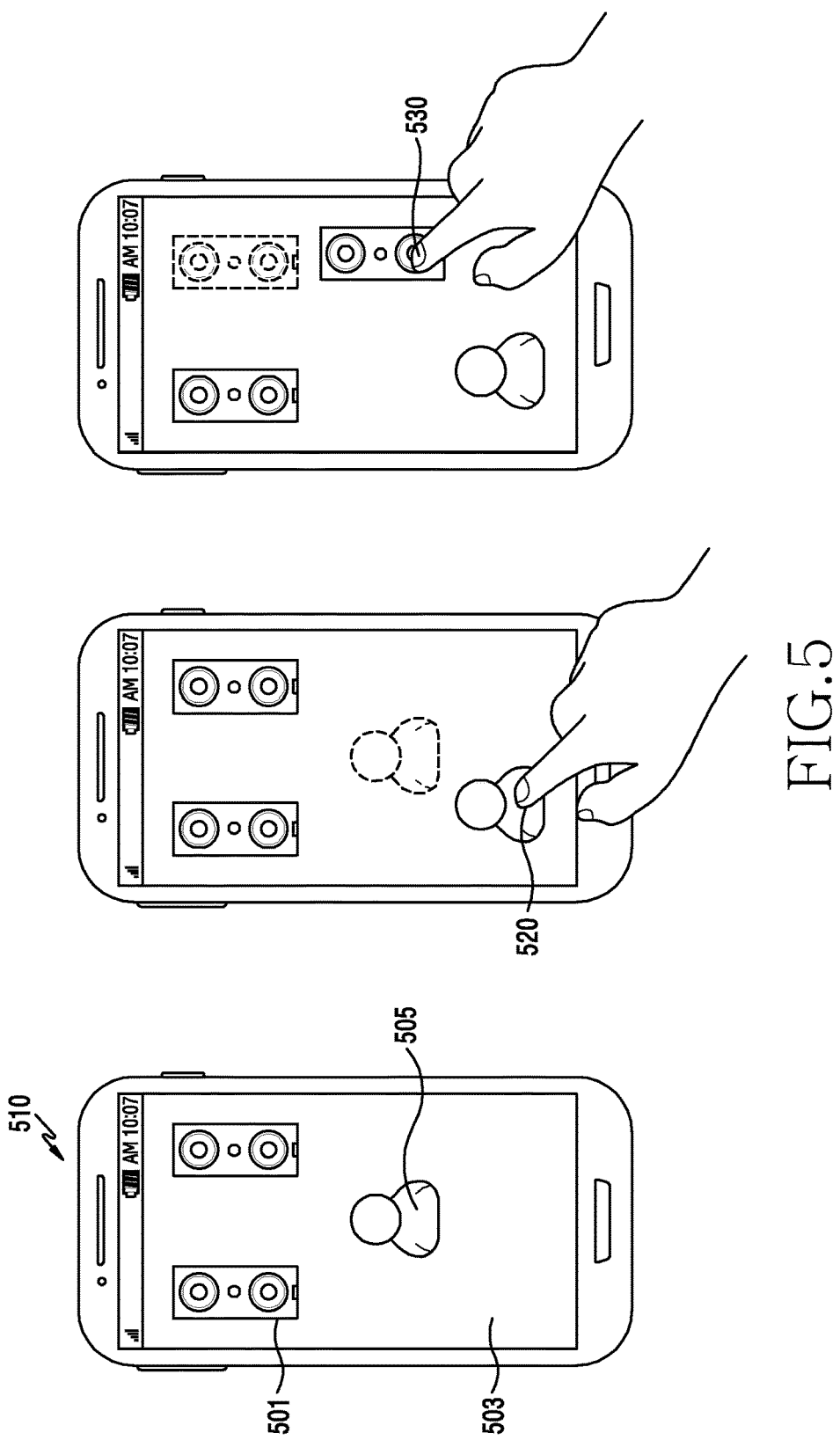
FIG. 5 is a diagram illustrating an operation of changing a sound for a content in an electronic device according to an embodiment of the present invention.
Figure 10:
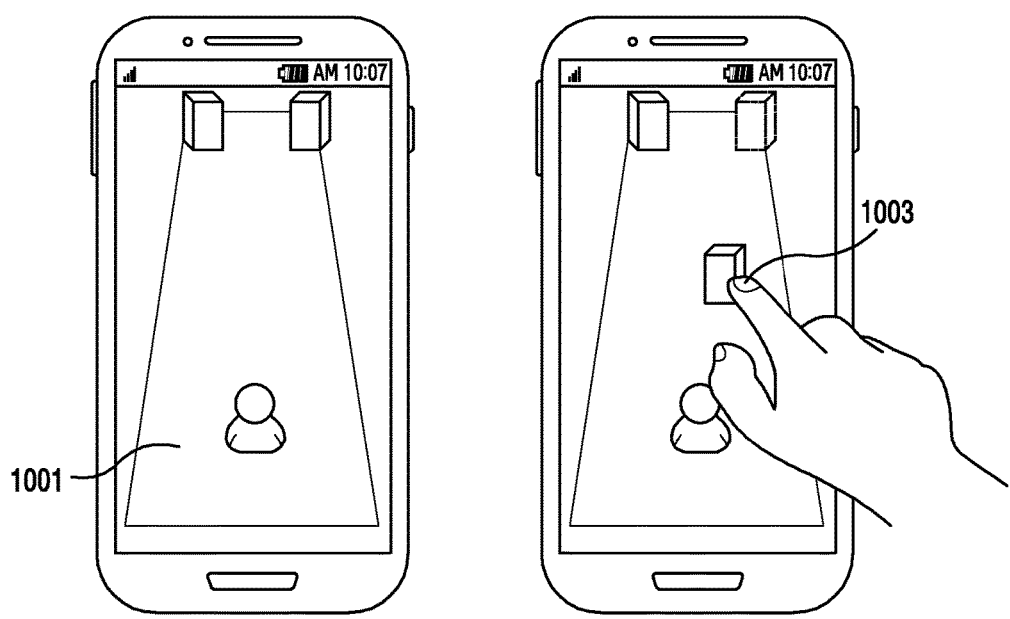
FIG. 10 is a diagram illustrating a screen which outputs a setting screen in an electronic device according to an embodiment of the present invention.

According to an embodiment of the present invention, as shown in FIGS. 5 and 10, the electronic device may define the reproduction environment to stress a sound source of a specific direction by detecting an input to move the location of the sound source (for example, a speaker), which is outputted when the content is reproduced, to the upper side, lower side, left side, or right side with reference to the user's location on the outputted setting screen.

Figure 6:
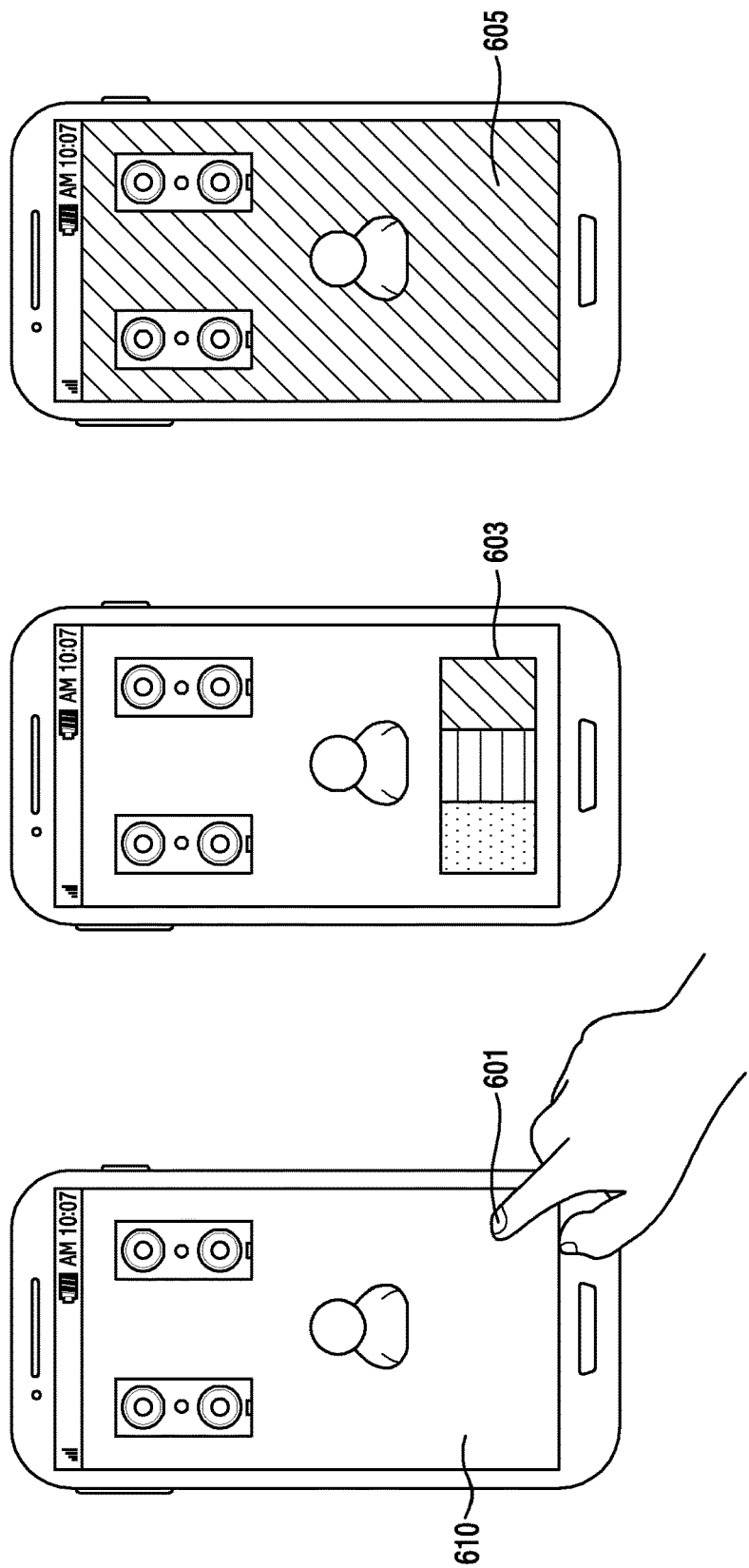
FIG. 6 is a diagram illustrating an operation of changing a sound of a content in an electronic device according to an embodiment of the present invention.
Figure 7:
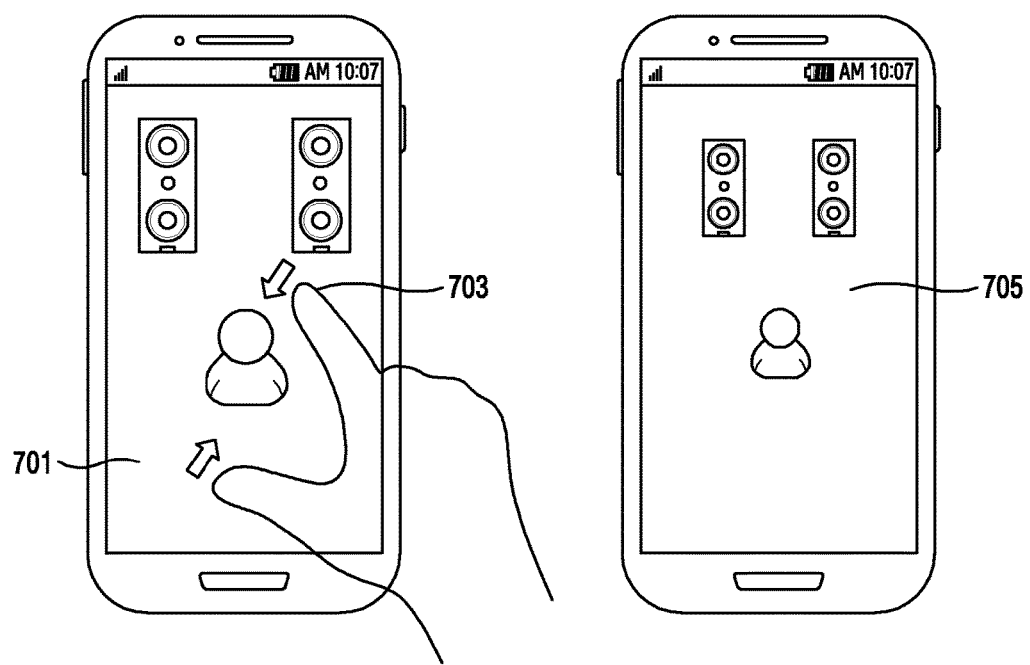
FIG. 7 is a diagram illustrating an operation of changing a sound of a content in an electronic device according to an embodiment of the present invention.

According to various embodiments of the present invention, as shown in FIGS. 6 and 7, the electronic device may define the reproduction environment to stress the echo and reverberation by detecting an input to select the material of the space or the size of the space on the outputted setting screen.

Figure 8:
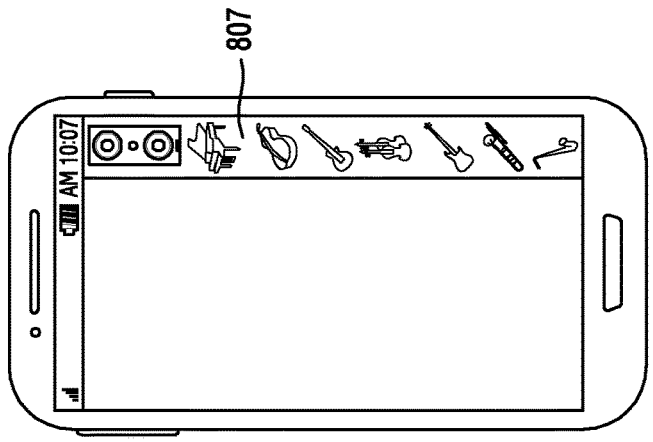
FIG. 8 is a diagram illustrating an operation of changing a sound of a content in an electronic device according to an embodiment of the present invention.
Figure 8:
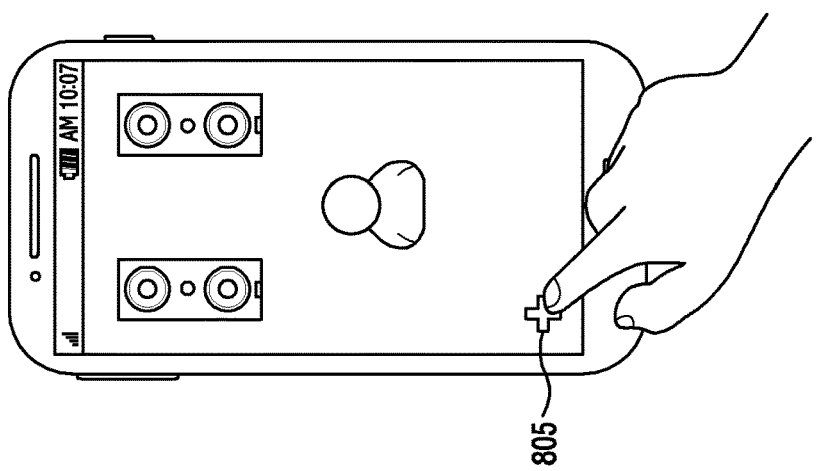
Figure 8:
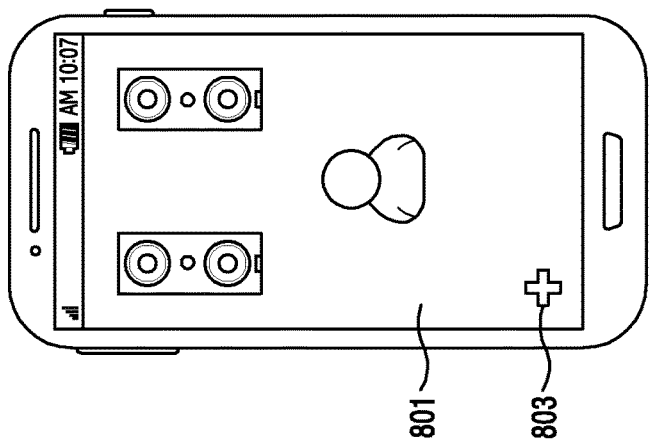
Figure 9:
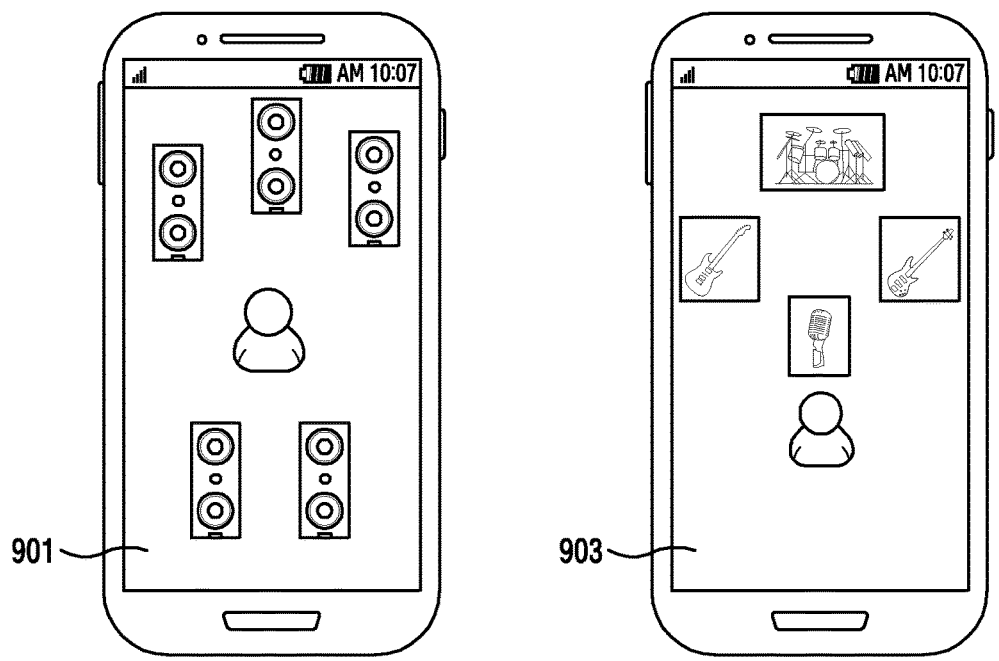
FIG. 9 is a diagram illustrating an operation of changing a sound of a content in an electronic device according to an embodiment of the present invention.

According to various embodiments of the present invention, as shown in FIGS. 8 and 9, the electronic device may define the reproduction environment to provide the 3D effect by detecting an input to add a sound source on the outputted setting screen.

According to various embodiments of the present invention, as shown in FIGS. 8 and 9, the electronic device may define the reproduction environment to stress a specific register by detecting an input to add a musical instrument related to the specific register on the outputted setting screen.

According to various embodiments of the present invention, the electronic device may change settings of a music field or an equalizer according to each of the reproduction environments.

In step 307, the electronic device stores the reproduction environment (or spatial characteristic) which is set or defined in response to the input.

In step 309, the electronic device detects a content reproduction request, and, in step 311, the electronic device reproduces the content based on the stored reproduction environment (or spatial characteristic).

Figure 4:
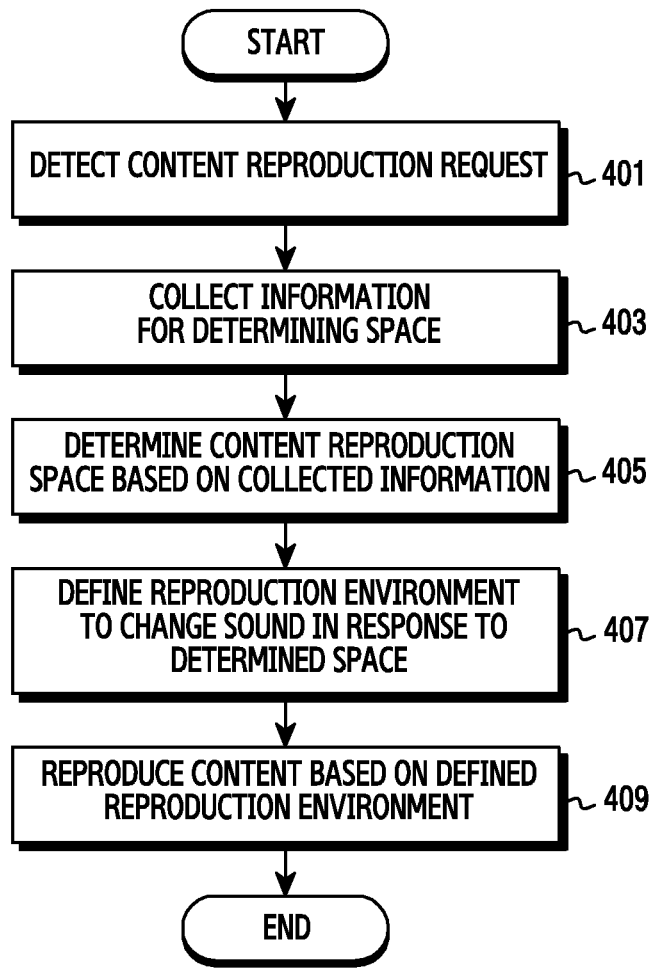
FIG. 4 is a flowchart illustrating a content reproduction operation of an electronic device according to an embodiment of the present invention.

FIG. 4 is a flowchart illustrating a content reproduction operation of an electronic device according to an embodiment of the present invention.

According to various embodiments of the present invention, the electronic device may detect a spatial characteristic based on environment information or situation information.

In step 401, the electronic device detects a content reproduction request. According to various embodiments of the present invention, the electronic device may call a content which is stored internally (for example, in a memory) or externally (for example, in a server or another electronic device), and reproduce the content.

In step 403, the electronic device collects information for determining a space where the content is reproduced, that is, a space where the electronic device is located. According to various embodiments of the present invention, the electronic device may collect environment information or situation environment for determining the space. According to an embodiment of the present invention, the environment information may be information on a surrounding environment at the time of reproducing the content, and the electronic device may determine the surrounding environment of the electronic device by recognizing information on ambient brightness, a surrounding image, or information of an ambient sound. According to an embodiment of the present invention, the situation information may be information on the state of the electronic device which reproduces the content, and the electronic device may determine the state of the electronic device by recognizing time displayed on the electronic device or movement of the electronic device.

According to various embodiments of the present invention, the electronic device may acquire the situation information and the environment information using an image sensor, a microphone, or a plurality of sensors for determining an environment or a situation. According to an embodiment of the present invention, the plurality of sensors may include a grip sensor, a geomagnetic sensor, an acceleration sensor, a digital compass, a horizontal sensor, an optical sensor, a proximity sensor, and the like.

In step 405, the electronic device determines a content reproduction space. According to various embodiments of the present invention, the electronic device may determine the content reproduction space based on the environment information or the situation information. According to an embodiment of the present invention, the information may be an image which is acquired by the electronic device. For example, the electronic device may acquire an image by photographing the surroundings of the electronic device through an image sensor at the time of reproducing the content, and the electronic device may determine the type of the space (for example, a room) where the electronic device is currently located, the material of the wall of the space, and the size of the space by analyzing the acquired image.

In step 407, the electronic device defines a content reproduction environment so as to change a sound in response to determining the content reproduction space.

According to various embodiments of the present invention, the electronic device may define the reproduction environment so as to provide an echo (or reverb) effect, a reverberation effect, a 3D effect, or the like corresponding to the characteristic of the space determined based on the situation information or the environment information.

According to various embodiments of the present invention, the electronic device may store settings of a music field or an equalizer which should be changed according to each of the reproduction environments, and may change predefined settings to settings corresponding to the determined characteristic of the space.

In step 409, the electronic device reproduces the content based on the defined reproduction environment.

FIG. 5 is a diagram illustrating an operation of changing a sound of a content in an electronic device according to an embodiment of the present invention.

According to an embodiment of the present invention, the electronic device 501 outputs a setting screen 503 for defining a reproduction environment to stress a sound source of a specific direction regarding a content using a spatial characteristic. According to an embodiment of the present invention, the setting screen 503 may be a virtual space representing a space where the content is reproduced, and the electronic device 501 outputs the virtual space as a screen. FIG. 5 illustrates a situation in which a setting screen indicating a space where two speakers are placed in front of a user is outputted.

According to an embodiment of the present invention, the setting screen 503 may be configured to define the location of a sound source icon 501 or a user icon 505. According to an embodiment of the present invention, the location of the user icon 505 or the sound source icon 501, which is outputted to the setting screen 503, may be changed by a user's input.

According to an embodiment of the present invention, the electronic device 510 detects an input to change the location of the user icon 505, for example, a touch input, and changes the location of the user icon 505 to a new location 520 corresponding to the touch input.

According to an embodiment of the present invention, the electronic device 510 detects a touch input to change the location of the sound source icon 501 and change the location of the sound source icon 501 to a new location 530 corresponding to the touch input, in a similar method to the method of changing the location of the user.

According to various embodiments of the present invention, the electronic device may change settings of a music field or an equalizer based on the location of the sound source icon 501 or the user icon 505 which is changed by the user's input. For example, when it is determined that the sound source icon 501 placed on the right side in front of the user icon 505 is moved to the right side of the user icon 505, the electronic device may change the settings of the music field or equalizer so that the right-side sound can be heard well (e.g., the volume of the right-side sound is increased) when the content is reproduced.

According to various embodiments of the present invention, the electronic device changes the settings of the music field or the equalizer based on the location of the sound source icon 501 or the user icon 505 changed by the input, and then may restore the changed location of the sound source icon 501 or the user icon 505 to the original location.

For example, the user may place the sound source near to the right side of the user icon 505 to stress the right-side sound, but such settings may be recognized as a user's physical handicap indicating that user's right-side hearing is not good. If this recognition is not correct, the electronic device may change the settings of the music field or the equalizer and then restore the changed location of the sound source icon 501 or the user icon 505 to the original location.

According to various embodiments of the present invention, the electronic device may detect an input to adjust the size of the sound source icon 501, and determine how much the sound is changed according to the size of the sound source icon 501 changed by the input. For example, when the electronic device detects an input to increase the size of the right-side sound source icon 501 two times, the electronic device may change the settings of the sound field or the equalizer so that the volume of the right-side sound is increased two times.

FIG. 6 is a diagram illustrating an operation of changing a sound of a content in an electronic device according to an embodiment of the present invention.

According to various embodiments of the present invention, the electronic device may output a setting screen for adjusting an echo (reverb) effect regarding a content using a spatial characteristic. According to various embodiments of the present invention, the setting screen may be configured to define the location of a sound source icon or a user icon and additionally define the material of a space where the content is reproduced. According to an embodiment of the present invention, the electronic device may provide an effect of stressing an echo according to the material of the space.

According to an embodiment of the present invention, the setting screen may be a virtual space representing a space where the content is reproduced, and the background 610 of the setting screen may indicate the material of the space where the content is reproduced.

For example, the electronic device outputs a list of materials icons 603 for the virtual space in response to detecting an input to set the material of the space, for example, a touch input 601. According to an embodiment of the present invention, the material may include a carpet material, a tile material, a wood material, and the like.

According to an embodiment of the present invention, when the electronic device detects an input to select a material icon from the outputted list, the electronic device applies the selected material icon 605 to the setting screen such that the background is displayed as the selected material icon 605.

According to various embodiments of the present invention, the electronic device may define settings of an equalizer or a music field on each of the materials icons, and process an effect corresponding to the selected material icon to be set. For example, since the sound is absorbed by a carpet material, the electronic device may process not to bring up the echo effect when the carpet material icon is selected by the user. As another example, since the sound is reflected by a tile material, the electronic device may process to increase the echo effect when the tile material icon is selected by the user.

FIG. 7 is a diagram illustrating an operation of changing a sound of a content in an electronic device, according to an embodiment of the present invention.

According to an embodiment of the present invention, the electronic device outputs a setting screen 701 for adjusting a reverberation effect regarding a content using a spatial characteristic. According to an embodiment of the present invention, the setting screen 701 may be configured to adjust the size of a virtual space representing a space where the content is reproduced. According to an embodiment of the present invention, the electronic device may provide an effect of stressing the reverberation effect according to the size of the virtual space.

According to an embodiment of the present invention, the setting screen 701 may be a virtual space representing a space where the content is reproduced, and the background of the setting screen may indicate the size of the space where the content is reproduced or a magnification of the size.

For example, in response to detecting an input to set the size of the virtual space, for example, a touch input 703, the electronic device may process to magnify or reduce the size of the virtual space which is currently outputted.

According to various embodiments of the present invention, the electronic device may define settings of an equalizer or a music field effect on each of the sizes, and process to set an effect corresponding to a selected size.

For example, when content is reproduced in a large space in reality, the reverberation effect may be increased. Therefore, when the size of the virtual space is magnified by the user, the electronic device may process to increase the reverberation effect. As another example, when content is reproduced in a small space in reality, the reverberation may be reduced. Therefore, when the size of the virtual space is reduced by the user, the electronic device may process to reduce the reverberation effect.

According to various embodiments of the present invention, the electronic device may adjust the configurations included in the setting screen, for example, the size of the user icon or the sound source icon, according to the size of the virtual space which is changed by the user's input.

FIG. 8 is a diagram illustrating an operation of changing a sound of a content in an electronic device according to an embodiment of the present invention.

According to an embodiment of the present invention, the electronic device may output a setting screen 801 for adjusting a 3D effect or the like regarding a content using a spatial characteristic. According to an embodiment of the present invention, the setting screen 801 may include a menu icon 803 to add or delete a musical instrument or a sound source for stressing a specific register.

According to an embodiment of the present invention, in response to detecting an input to set a sound source or a musical instrument, for example, a touch input 805, the electronic device may output a list of musical instruments icons or sound sources icons 807 to add to the currently outputted setting screen.

FIG. 9 is a diagram illustrating an operation of changing a sound of a content in an electronic device according to an embodiment of the present invention.

According to an embodiment of the present invention, the electronic device may output a list of musical instruments icons or sound sources icons to be added to the currently outputted setting screen, and may identify settings in the setting screen 901 for providing a 3D effect in response to an input or identify settings in the setting screen 903 for stressing a specific register.

According to an embodiment of the present invention, the electronic device may provide the 3D effect in response to an input to add a sound source. For example, the electronic device may provide a 2.1 channel effect, a 5.1 channel effect, or the like according to the locations or number of sound sources added by the input. According to an embodiment of the present invention, the electronic device may identify settings which detect an input to add a sound source of the list outputted in FIG. 8 to the setting screen, and provide the 3D effect.

According to an embodiment of the present invention, the electronic device may provide an effect of stressing a specific register by adding a musical instrument icon in response to the input to add the musical instrument. According to an embodiment of the present invention, the electronic device may process to provide an effect of stressing a low-pitched tone in response to an input to add a musical instrument for stressing a low-pitched tone to the setting screen.

According to an embodiment of the present invention, the electronic device may provide an effect of stressing a specific register using a vocalization part. For example, the electronic device may provide an effect of stressing a low-pitched tone in response to an input to add a part for vocalizing a low-pitched tone (for example, a bass part).

According to an embodiment of the present invention, when the electronic device detects an input to designate a location of a musical instrument as a sound source, the electronic device may provide an effect of stressing a specific register based on the location of each musical instrument. For example, the electronic device may process to bring up the sound of vocals at a short distance, and process to bring up the sound of a drum at a long distance, in response to the input.

FIG. 10 is a diagram illustrating a screen which outputs a setting screen in an electronic device according to an embodiment of the present invention.

According to various embodiments of the present invention, the electronic device may output a setting screen using part of the screen as a virtual space representing a space where a content is reproduced. According to various embodiments of the present invention, the electronic device may output a setting screen having a 3D effect.

According to various embodiments of the present invention, the electronic device may output a setting screen as a virtual space representing a space where a sound source is placed with reference to a user's view point.

According to various embodiments of the present invention, the electronic device may change the displayed location of the sound source icon or the user icon in response to an input.

For example, the electronic device may output a setting screen 1001 informing that two sound sources are located in front of the user (i.e., two sound sources icons are located in front of the user icon), and detect a user's input 1003 to move the sound source icon placed on the right side in front of the user icon near to the user icon. According to an embodiment of the present invention, the electronic device may detect the input and reproduce the content so as to stress the right-side sound of the user.

According to various embodiments of the present invention, the electronic device may acquire an image in which a sound source exists and use the image as a setting screen. According to an embodiment of the present invention, the electronic device may identify a sound source by analyzing a pre-stored image or an image which is acquired through an image sensor by an input, and identify the location of the sound source corresponding to a sound source icon which is moved by an input. According to another embodiment of the present invention, the electronic device may use an image displayed using an augmented reality technique as the setting screen. According to various embodiments of the present invention, an operation method of an electronic device may include outputting a setting screen for defining a spatial characteristic for a content reproduction environment; defining the spatial characteristic by detecting an input on the outputted setting screen; and changing a sound of a content and reproducing the content based on the defined spatial characteristic.

According to various embodiments of the present invention, defining the spatial characteristic may include determining a location of a sound source with respect to a location of a user.

According to various embodiments of the present invention, defining the spatial characteristic may include: outputting a list of sound sources icons to be added to the setting screen; and placing a selected sound source in the list of sound sources icons on the setting screen in response to an input.

According to various embodiments of the present invention, defining the spatial characteristic may include determining at least one of a size of a space where the content is reproduced and a material of the space.

According to various embodiments of the present invention, changing the sound of the content and reproducing the content based on the defined spatial characteristic may include changing settings of an equalizer or a music field based on the spatial characteristic.

According to various embodiments of the present invention, outputting the list of sound sources icons to be added to the setting screen may include outputting a list of musical instruments icons related to a specific register.

According to various embodiments of the present invention, the operation method may further include changing the sound of content using a frequency related to a musical instrument corresponding to a musical instrument icon in the list of sound sources icons placed in the setting screen.

According to various embodiments of the present invention, the operation method may further include defining the spatial characteristic by analyzing an image related to a surrounding environment.

Figure 11:
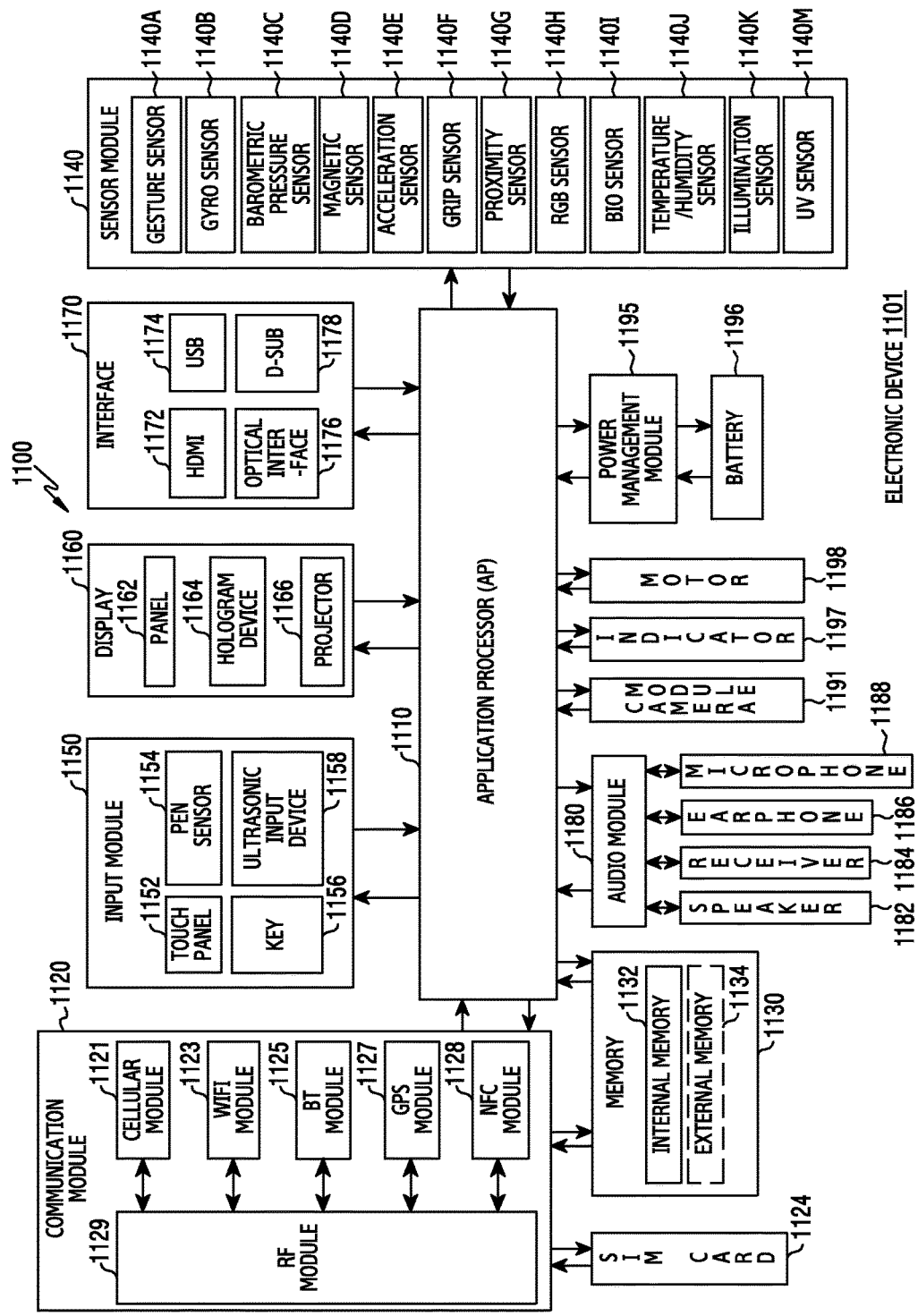
FIG. 11 is a block diagram illustrating a configuration of an electronic device according to an embodiment of the present invention.

FIG. 11 is a block diagram 1100 illustrating an electronic device 1101 according to an embodiment of the present invention. The electronic device 1101 may configure, for example, all or a portion of the electronic device 101 illustrated in FIG. 1. Referring to FIG. 11, the electronic device 1101 may include one or more application processors (AP) 1110, a communication module 1120, a subscriber identification module (SIM) card 1124, a memory 1130, a sensor module 1140, an input unit 1150, a display 1160, an interface 1170, an audio module 1180, a camera module 1191, a power management module 1195, a battery 1196, an indicator 1197, or a motor 1198.

The AP 1110 drives an operating system (OS) or an application to control a plurality of hardware or software elements connected to the AP 1110, and performs various data processes including multimedia data and operations. The AP 1110 may be implemented, for example, as a system on chip (SoC). According to an embodiment of the present invention, the AP 1110 may further include a GPU.

The communication module 1120 (e.g., the communication interface 160) performs data transmission/reception in communication between the electronic device 1101 (e.g., the electronic device 101) and other electronic devices (e.g., the electronic device 104 or the server 106) connected via a network. According to an embodiment of the present invention, the communication module 1120 may include a cellular module 1121, a Wi-Fi module 1123, a BT module 1125, a GPS module 1127, an NFC module 1128, and a Radio Frequency (RF) module 1129.

The cellular module 1121 provides voice communication, image communication, a short message service, or an Internet service, etc. via a communication network (e.g., LTE, LTE-A, CDMA, WCDMA, UMTS, WiBro, or GSM, etc.). Also, the cellular module 1121 may perform discrimination and authentication of an electronic device within a communication network using, for example, a SIM card 1124. According to an embodiment of the present invention, the cellular module 1121 may perform at least a portion of functions that may be provided by the AP 1110. For example, the cellular module 1121 may perform at least a portion of a multimedia control function.

According to an embodiment of the present invention, the cellular module 1121 may include a communication processor (CP). Also, the cellular module 1121 may be, for example, implemented as a SoC. Though elements such as the cellular module 1121 (e.g., a communication processor), the memory 1130, or the power management module 1195, etc. are illustrated as elements separated from the AP 1110 in FIG. 11, according to an embodiment of the present invention, the AP 1110 may be implemented to include at least a portion (e.g., the cellular module 1121) of the above-described elements.

According to an embodiment of the present invention, the AP 1110 or the cellular module 1121 (e.g., a communication processor) may load an instruction or data received from at least one of a non-volatile memory and other elements connected thereto onto a volatile memory, and process the same. Also, the AP 1110 or the cellular module 1121 may store data received from at least one of other elements or generated by at least one of other elements in a non-volatile memory.

Each of the Wi-Fi module 1123, the BT module 1125, the GPS module 1127, or the NFC module 1128 may include, for example, a processor for processing data transmitted/received via a relevant module. Though the cellular module 1121, the Wi-Fi module 1123, the BT module 1125, the GPS module 1127, or the NFC module 1128 are illustrated as separate blocks in FIG. 11, according to an embodiment of the present invention, at least a portion (e.g., two or more elements) of the cellular module 1121, the Wi-Fi module 1123, the BT module 1125, the GPS module 1127, or the NFC module 1128 may be included in one Integrated Circuit (IC) or an IC package. For example, at least a portion (e.g., a communication processor corresponding to the cellular module 1121 and a Wi-Fi processor corresponding to the Wi-Fi module 1123) of processors corresponding to each of the cellular module 1121, the Wi-Fi module 1123, the BT module 1125, the GPS module 1127, or the NFC module 1128 may be implemented as one SoC.

The RF module 1129 performs transmission/reception of data, for example, transmission/reception of an RF signal. The RF module 1129 may include, for example, a transceiver, a power amp module (PAM), a frequency filter, or a low noise amplifier (LNA), etc. Also, the RF module 1129 may further include a part for transmitting/receiving an electromagnetic wave on a free space in wireless communication, for example, a conductor or a conducting line, etc. Though FIG. 11 illustrates the cellular module 1121, the Wi-Fi module 1123, the BT module 1125, the GPS module 1127, and the NFC module 1128 share one RF module 1129, according to an embodiment of the present invention, at least one of the cellular module 1121, the Wi-Fi module 1123, the BT module 1125, the GPS module 1127, or the NFC module 1128 may perform transmission/reception of an RF signal via a separate RF module.

The SIM card 1124 may be inserted into a slot formed in a specific position of the electronic device. The SIM card 1124 may include unique identify information (e.g., integrated circuit card identifier (ICCID)) or subscriber information (e.g., international mobile subscriber identity (IMSI)).

The memory 1130 (e.g., the memory 110) may include a built-in (internal) memory 1132 or an external memory 1134. The built-in memory 1132 may include, for example, at least one of a volatile memory (e.g., dynamic random access memory (RAM) (DRAM), static RAM (SRAM), synchronous dynamic RAM (SDRAM)) and a non-volatile memory (e.g., one time programmable read only memory (ROM) (OTPROM), programmable ROM (PROM), erasable and programmable ROM (EPROM), electrically erasable and programmable ROM (EEPROM), mask ROM, flash ROM, NAND flash memory, NOR flash memory, etc.).

According to an embodiment of the present invention, the built-in memory 1132 may be a Solid State Drive (SSD). The external memory 1134 may further include a flash drive, for example, compact flash (CF), secure digital (SD), micro secure digital (Micro-SD), mini secure digital (Mini-SD), extreme digital (xD), or a memory stick. The external memory 1134 may be functionally connected with the electronic device 1101 via various interfaces. According to an embodiment of the present invention, the electronic device 1101 may further include a storage device (or a storage medium) such as a hard drive.

The sensor module 1140 measures a physical quantity or detects an operation state of the electronic device 1101, and converts the measured or detected information to an electric signal. The sensor module 1140 may include, for example, at least one of a gesture sensor 1140A, a gyro sensor 1140B, an atmospheric pressure sensor 1140C, a magnetic sensor 1140D, an acceleration sensor 1140E, a grip sensor 1140F, a proximity sensor 1140G, a color sensor 1140H (e.g., RGB (red, green, blue) sensor), a living body (bio) sensor 1140I, a temperature/humidity sensor 1140J, an illuminance sensor 1140K, or an ultra violet (UV) sensor 1140M. Alternatively, the sensor module 1140 may include, for example, an E-nose sensor, an electromyography (EMG) sensor, an electroencephalogram (EEG) sensor, an electrocardiogram (ECG) sensor, an infrared (IR) sensor, an iris sensor, or a fingerprint sensor, etc. The sensor module 1140 may further include a control circuit for controlling at least one sensor belonging thereto.

The input unit 1150 may include a touch panel 1152, a (digital) pen sensor 1154, a key 1156, or an ultrasonic input unit 1158. The touch panel 1152 recognizes a touch input using at least one of capacitive, resistive, infrared, or ultrasonic methods. Also, the touch panel 1152 may further include a control circuit. A capacitive touch panel may perform detection by a physical contact or proximity recognition. The touch panel 1152 may further include a tactile layer. In this case, the touch panel 1152 may provide a tactile reaction to a user.

The (digital) pen sensor 1154 may be implemented using, for example, a method which is the same as or similar to that of receiving a user's touch input, or using a separate sheet for detection. The key 1156 may include, for example, a physical button, an optical key or keypad. The ultrasonic input unit 1158 is a unit for recognizing data by detecting a sound wave using a microphone (e.g., a microphone 1188) in the electronic device 1101 via an input tool generating an ultrasonic signal, and enables wireless recognition. According to an embodiment of the present invention, the electronic device 1101 may receive a user input from an external device (e.g., a computer or a server) connected to the communication module 1120 using the communication module 1120.

The display 1160 (e.g., the display 150) may include a panel 1162, a hologram device 1164, or a projector 1166. The panel 1162 may be, for example, a liquid crystal display (LCD), or an active-matrix organic light-emitting diode (AM-OLED), etc. The panel 1162 may be implemented, for example, such that it is flexible, transparent, or wearable. The panel 1162 may be configured as one module together with the touch panel 1152. The hologram device 1164 shows a three-dimensional image in the air using interferences of light. The projector 1166 projects light onto a screen to display an image. The screen may be positioned, for example, inside or outside the electronic device 1101. According to an embodiment of the present invention, the display 1160 may further include a control circuit for controlling the panel 1162, the hologram device 1164, or the projector 1166.

The interface 1170 may include, for example, a high-definition multimedia interface (HDMI) 1172, a universal serial bus (USB) 1174, an optical interface 1176, or a D-subminiature (D-sub) 1178. The interface 1170 may be included, for example, in the communication interface 160 illustrated in FIG. 1. Alternatively, the interface 1170 may include, for example, a mobile high-definition link (MHL) interface, a secure digital (SD) card/multi-media card (MMC) interface, or an infrared data association (IrDA) standard interface.

The audio module 1180 converts a sound and an electric signal in dual directions. At least a partial element of the audio module 1180 may be included, for example, in the I/O interface 140 illustrated in FIG. 1. The audio module 1180 may process sound information input or output via, for example, a speaker 1182, a receiver 1184, an earphone 1186, or the microphone 1188, etc.

The camera module 1191 is a device that may shoot a still image and a moving picture. According to an embodiment of the present invention, the camera module 1191 may include one or more image sensors (e.g., a front sensor or a rear sensor), a lens, an image signal processor (ISP), or a flash (e.g., an LED or xenon lamp).

The power management module 1195 manages power of the electronic device 1101. The power management module 1195 may include, for example, a power management integrated circuit (PMIC), a charger integrated circuit (IC), or a battery or a battery gauge.

The PMIC may be mounted, for example, inside an integrated circuit or an SoC semiconductor. A charging method may be classified into a wired charging method and a wireless charging method. The charging IC may charge a battery and prevent introduction of an overvoltage or an overcurrent from a charger. According to an embodiment of the present invention, the charging IC may include a charging IC for at least one of the wired charging method and the wireless charging method. The wireless charging method may be, for example, a magnetic resonance method, a magnetic induction method, or an electromagnetic wave method, etc., and may additionally include an additional circuit for wireless charging, for example, a circuit such as a coil loop, a resonance circuit, or a rectifier, etc.

The battery gauge measures, for example, a remnant of the battery 1196, a voltage, a current, or a temperature while charging. The battery 1196 stores or generates electricity, and supplies power to the electronic device 1101 using the stored or generated electricity. The battery 1196 may include, for example, a rechargeable battery or a solar battery.

The indicator 1197 displays a specific state of the electronic device 1101 or a portion thereof (e.g., the AP 1110), for example, a booting state, a message state, or a charging state, etc. The motor 1198 converts an electric signal to mechanical vibration. The electronic device 1101 may include a processor (e.g., a GPU) for supporting a mobile TV. The processor for supporting the mobile TV may process media data corresponding to standards, for example, such as digital multimedia broadcasting (DMB), digital video broadcasting (DVB), or a media flow, etc.

A method and apparatus for reproducing a content in an electronic device according to various embodiments of the present invention may provide a setting screen which defines a spatial characteristic of a space where a content is reproduced, and change a sound easily according to a situation.

Various embodiments of the present invention disclosed herein and shown in the drawings are merely specific examples presented in order to easily describe technical details of the present invention and to help the understanding of the present invention, and are not intended to limit the scope of the present invention. Therefore, it should be construed that, in addition to the embodiments disclosed herein, all modifications and changes or modified and changed forms derived from the technical idea of the present invention fall within the scope of the present invention as defined by the appended claims and their equivalents.

What is claimed is:

1. An electronic device comprising:
   a display;
   a memory; and
   a processor configured to:
   output a setting screen on the display for defining a spatial characteristic for a content reproduction environment, wherein the setting screen comprises a virtual space where the content is reproduced and a plurality of icons included in the virtual space, and wherein the plurality of icons comprises an icon indicating a sound source;
   detect an input of a user;
   determine a spatial characteristic of the virtual space, based on the detected user input and at least one of environment information or situation information acquired by the electronic device, store the spatial characteristic in the memory, and change a sound of the content based on the spatial characteristic when the content is reproduced.

2. The electronic device of claim 1, wherein the spatial characteristic defines a virtual space where the content is reproduced.

3. The electronic device of claim 1, wherein the processor is further configured to determine the spatial characteristic based on at least one of a size of the space where the content is reproduced, a material of the space, a location of a sound source in the space, a size of the sound source in the space, and a location of a user in the space.

4. The electronic device of claim 1, wherein the processor is further configured to supplement a frequency characteristic of the sound of the content based on the spatial characteristic.

5. The electronic device of claim 1, wherein the processor is further configured to provide a three dimensional (3D) effect for the sound of the content based on the spatial characteristic.

6. The electronic device of claim 2, wherein the processor is further configured to identify the environment information based on at least one of brightness information related to a surrounding environment, an image related to the surrounding environment, and sound information related to the surrounding environment.

7. The electronic device of claim 2, wherein the processor is further configured to identify the situation information based on information related to at least one of time displayed on the electronic device and movement of the electronic device.

8. The electronic device of claim 1, wherein the processor is further configured to output a list of sound source icons to be added to the setting screen.

9. The electronic device of claim 8, wherein the processor is further configured to change the sound of the content using a frequency related to a musical instrument selected from the list of musical instruments.

10. An operation method of an electronic device, the operation method comprising:
    outputting a setting screen on a display for defining a spatial characteristic for a content reproduction environment, wherein the setting screen comprises a virtual space where the content is reproduced and a plurality of icons included in the virtual space, wherein the plurality of icons comprises an icon indicating a sound source;
    detecting a user input;
    defining the spatial characteristic of the virtual space based on the detected user input and at least one of environment information or situation information acquired by the electronic device; and
    changing a sound of content and reproducing the content based on the spatial characteristic.

11. The operation method of claim 10, wherein defining the spatial characteristic comprises determining a location of a sound source with respect to a location of the user.

12. The operation method of claim 10, wherein defining the spatial characteristic comprises:
    outputting a list of sound source icons to be added to the setting screen; and
    placing a selected sound source icon in the list of sound source icons on the setting screen in response to an input.

13. The operation method of claim 10, wherein defining the spatial characteristic comprises determining at least one of a size of a space where the content is reproduced and a material of the space.

14. The operation method of claim 10, wherein changing the sound of the content and reproducing the content based on the spatial characteristic comprise changing settings of an equalizer or a music field based on the defined spatial characteristic.

15. The operation method of claim 12, wherein outputting the list of sound source icons to be added to the setting screen comprises outputting a list of musical instruments icons related to a specific register.

16. The operation method of claim 15, wherein changing the sound of the content comprises changing the sound using a frequency related to a musical instrument corresponding to a musical instrument icon in the list of sound sources icons placed in the setting screen.

17. The operation method of claim 10, wherein defining the spatial characteristic comprises defining the spatial characteristic by analyzing an image related to a surrounding environment.

18. A non-transitory computer-readable recording medium which records a program for executing operations of:
    outputting a setting screen on a display for defining a spatial characteristic for a content reproduction environment, wherein the setting screen comprises a virtual space where the content is reproduced and a plurality of icons included in the virtual space, wherein the plurality of icons comprises an icon indicating a sound source;
    detecting a user input;
    defining the spatial characteristic based on the detected user input and at least one of environment information or situation information acquired by the electronic device; and changing a sound of a content and reproducing the content based on the spatial characteristic.

* * * * *